United States Patent
Krause et al.

(10) Patent No.: US 7,867,805 B2
(45) Date of Patent: Jan. 11, 2011

(54) STRUCTURE REPLICATION THROUGH ULTRA THIN LAYER TRANSFER

(75) Inventors: Rainer Krause, Raunheimerstr (DE); Markus Schmidt, Sandweg (DE)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 12/120,020

(22) Filed: May 13, 2008

(65) Prior Publication Data

US 2009/0283868 A1 Nov. 19, 2009

(30) Foreign Application Priority Data

May 24, 2007 (EP) .................. 07108816

(51) Int. Cl.
*H01L 21/00* (2006.01)
(52) U.S. Cl. .............. 438/57; 438/74; 257/E21.6; 257/E21.703
(58) Field of Classification Search ............ 438/57, 438/73, 74; 257/E21.6, E21.606, E21.703, 257/E21.208, E21.002

See application file for complete search history.

(56) References Cited

U.S. PATENT DOCUMENTS

| | | | | |
|---|---|---|---|---|
| 5,374,564 A * | 12/1994 | Bruel | ................... | 438/455 |
| 6,162,702 A * | 12/2000 | Morcom et al. | ............ | 438/459 |
| 6,964,732 B2 * | 11/2005 | Solanki | ................... | 204/194 |
| 7,420,147 B2 * | 9/2008 | Faris | ................... | 250/207 |
| 2001/0007789 A1 * | 7/2001 | Aspar et al. | ............ | 438/458 |

* cited by examiner

*Primary Examiner*—Caridad M Everhart
(74) *Attorney, Agent, or Firm*—Steven L. Bennett; Schubert Law Group PLLC

(57) ABSTRACT

Methods and apparatus for forming a product from ultra thin layers of a base material are disclosed. Some embodiments provide a process that allows one to structure a silicon base material, like the ingot, and to transfer this structure into a respective silicon process step. Some embodiments provide a process that allows one to structure any complex structured layer stacks, where the layers can be applied on top of each other using, e.g., bonding technology.

16 Claims, 6 Drawing Sheets

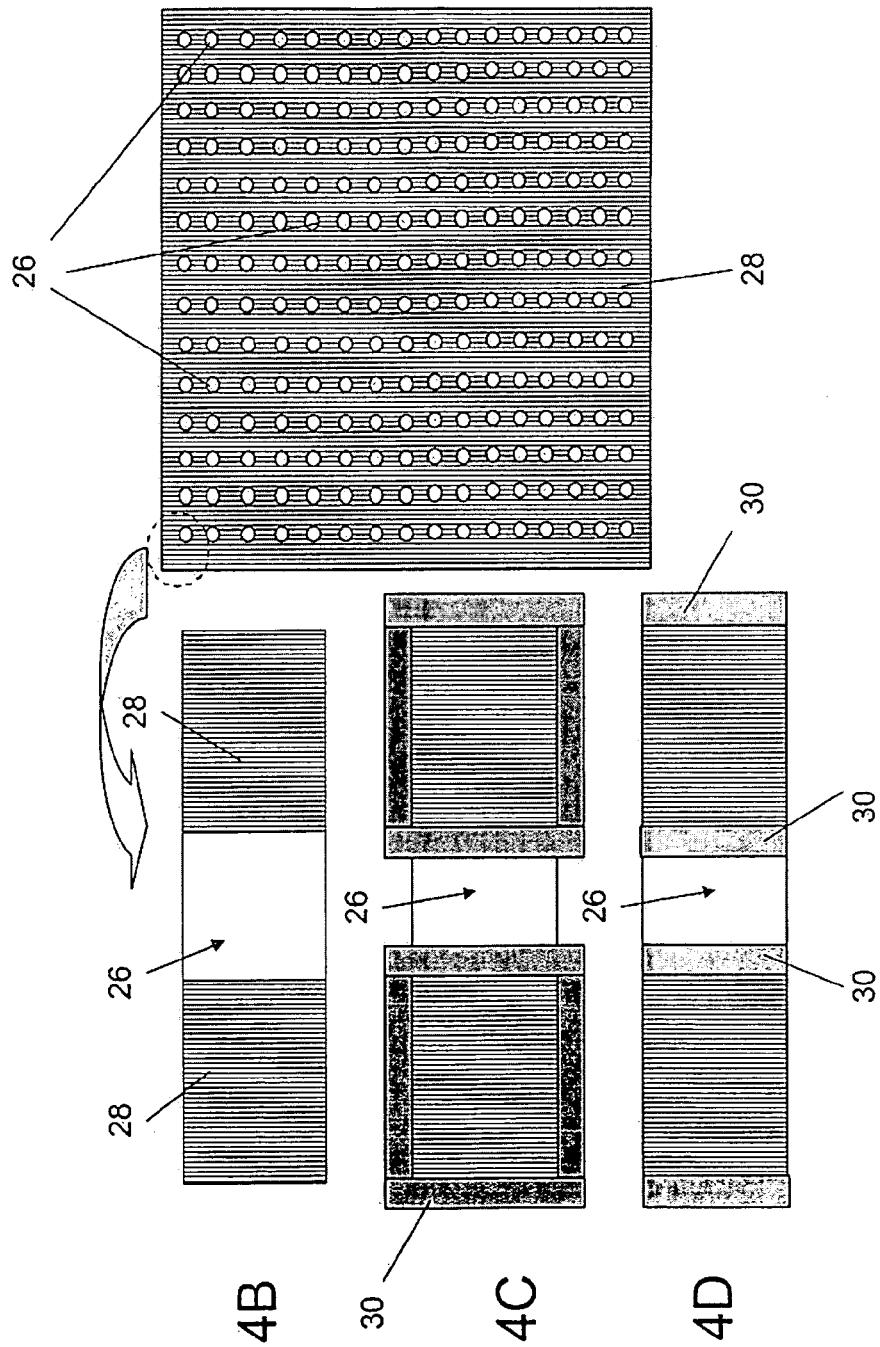

STRUCTURE REPLICATION THROUGH ULTRA THIN LAYER TRANSFER

FIELD

This written description relates in general to the formation of semiconductor, sensoric or photonic devices. More particularly, the description relates to the structuring of individual layers. Still more specifically, the description pertains to the structuring of ultra thin silicon layers.

BACKGROUND

Semiconductors with predictable, reliable electronic properties are necessary for mass production. The level of chemical purity needed is extremely high because the presence of impurities even in very small proportions can have large effects on the properties of the material. A high degree of crystalline perfection is also required, since faults in crystal structure (such as dislocation, twins and stacking faults) interfere with the semiconducting properties of the material. Crystalline faults are a major cause of defective semiconductor devices. The larger the crystal, the more difficult it is to achieve the necessary perfection. Current mass production processes use crystal ingots about 300 mm in diameter which are grown as cylinders and sliced into wafers.

Because of the required level of chemical purity and the perfection of the crystal structure which are needed to make semiconductor devices, special methods have been developed to produce the initial semiconductor material. A technique for achieving high purity includes growing the crystal using the Czochralski process. The Czochralski process is a method of crystal growth used to obtain single crystals of semiconductors (e.g., silicon, germanium and gallium arsenide), metals (e.g., palladium, platinum, silver, gold) and salts.

The most important application may be the growth of large cylindrical ingots or boules of single crystal silicon. High-purity, semiconductor-grade silicon (only a few parts per million of impurities) is melted down in a crucible, which is usually made of quartz. Dopant impurity atoms such as boron or phosphorus can be added to the molten intrinsic silicon in precise amounts in order to dope the silicon, thus changing it into n-type or p-type extrinsic silicon. This influences the electrical conductivity of the silicon. A seed crystal, mounted on a rod, is dipped into the molten silicon. The seed crystal's rod is pulled upwards and rotated at the same time. By precisely controlling the temperature gradients, rate of pulling and speed of rotation, it is possible to extract a large, single-crystal, cylindrical ingot from the melt. This process is normally performed in an inert atmosphere, such as argon, and in an inert chamber, such as quartz.

In semiconductor device fabrication, the various processing steps fall into four general categories: deposition, removal, patterning, and modification of electrical properties. Deposition is any process that grows, coats, or otherwise transfers a material onto the wafer. Available technologies consist of physical vapor deposition (PVD), chemical vapor deposition (CVD), electrochemical deposition (ECD), molecular beam epitaxy (MBE) and more recently, atomic layer deposition (ALD) among others.

Removal processes are any that remove material from the wafer either in bulk or selective form and consist primarily of etch processes, both wet etching and dry etching such as reactive ion etching (RIE). Chemical-mechanical polishing (CMP) is also a removal process used between levels.

Patterning covers the series of processes that shape or alter the existing shape of the deposited materials and is generally referred to as lithography. For example, in conventional lithography, the wafer is coated with a chemical, called a photoresist. The photoresist is exposed by a "stepper", a machine that focuses, aligns, and moves the mask, exposing select portions of the wafer to short wavelength light. The unexposed regions are washed away by a developer solution. After etching or other processing, the remaining photoresist is removed.

Modification of electrical properties has historically consisted of doping transistor sources and drains originally by diffusion furnaces and later by ion implantation. These doping processes are followed by furnace anneal or, in advanced devices, by rapid thermal anneal (RTA) which serve to activate the implanted dopants. Modification of electrical properties now also extends to reduction of dielectric constant in low-k insulating materials via exposure to ultraviolet light in UV processing (UVP).

Today, patterning or structuring of individual layers is performed at the process step of the specific layer, e.g., when forming a solar cell. A solar or photovoltaic cell is a device that converts photons from the sun (solar light) into electricity using electrons. In general, a solar cell that includes the capacity to capture both solar and non solar sources of light (such as photons from incandescent bulbs) is termed a photovoltaic cell. Fundamentally, the device needs to fulfill only two functions: photogeneration of charge carriers (electrons and holes) in a light-absorbing material, and separation of the charge carriers to a conductive contact that will transmit the electricity. This conversion is called the photovoltaic effect.

Silicon solar cell efficiencies vary from 6% for amorphous silicon-based solar cells to about 40% with multiple-junction research lab cells. Solar cell energy conversion efficiencies for commercially available mc-Si cells are around 14-16%. However, the highest efficiency cells have not always been the most economical—for example a 30% effective multi junction cell based on "exotic" materials such as gallium arsenide or indium selenide and produced in low volume might well cost one hundred times as much as an 8% efficient amorphous silicon cell in mass production, while only delivering about four times the electrical power.

As already mentioned before, patterning or structuring of individual layers today is performed at the process step of the specific layer. For example, when manufacturing a solar cell, front contacting is performed only when the solar cell is complete. This, however, has the disadvantage of light shading that will lead to a loss of surface area and will thus generate a 5-8% loss in efficiency.

SUMMARY

The problems identified above are addressed in large part by systems and methods of structuring individual silicon layers to form a product of a process. One method comprises providing a base material. Applied to the base material are desired structures to be transferred to the process product. These structures are transferred in ultra thin layers to the product. In one embodiment, the base material is a silicon wafer or a silicon ingot. In some embodiments, transferring is done by an exfoliation process. The exfoliation process may be performed by ion implantation. In some embodiments, the desired structures are chosen from lines, holes or mesa structures.

BRIEF DESCRIPTION OF THE DRAWINGS

Embodiments will be described in more detail below in connection with the accompanying drawings, in which

FIGS. 4A to 4D schematically depict the structuring of an ingot for backside contacts.

DETAILED DESCRIPTION

Figure 1:
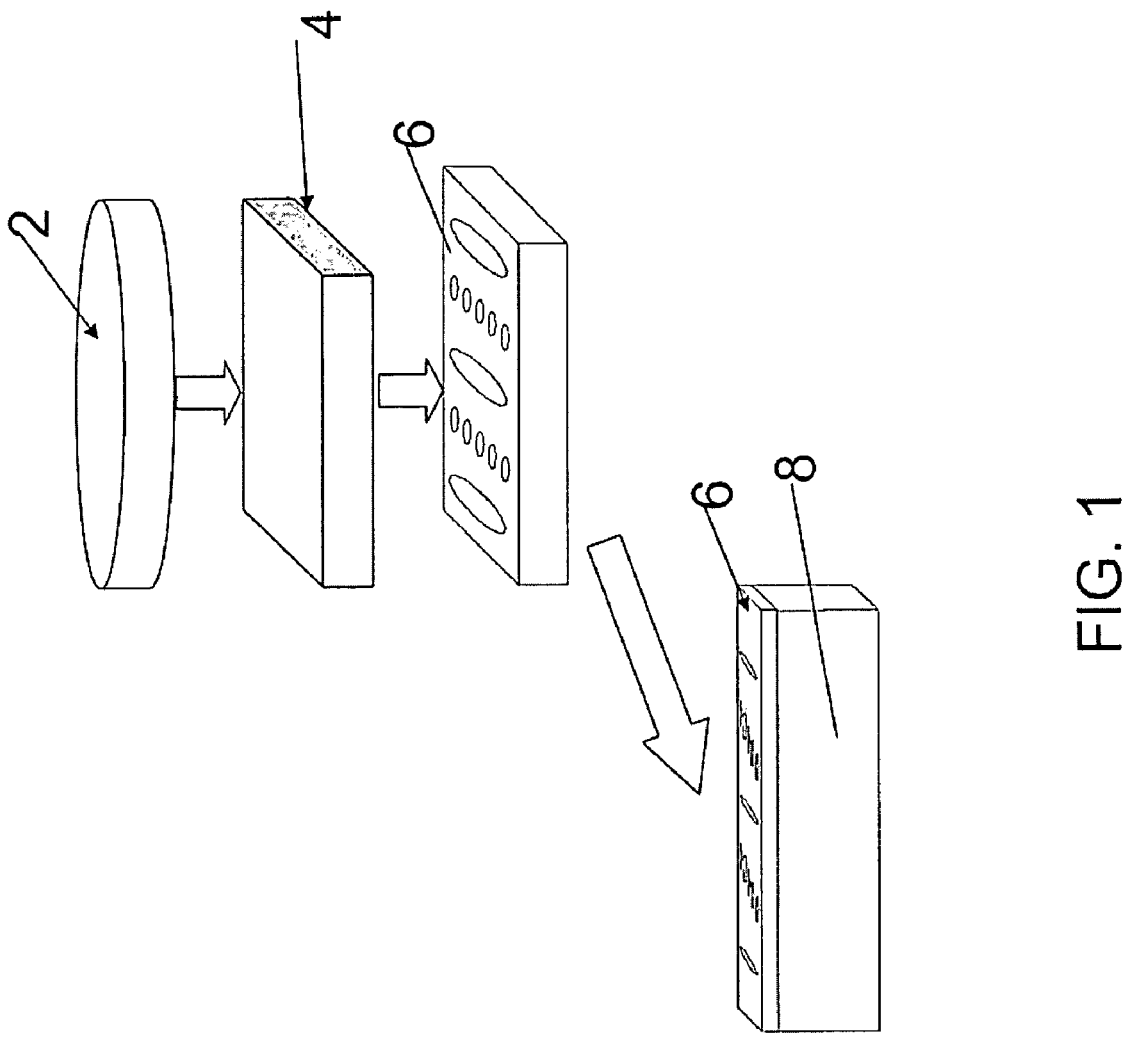
FIG. 1 is a process flow to create ultra thin Si layers with a defined structure from a Si ingot.
Figure 1:
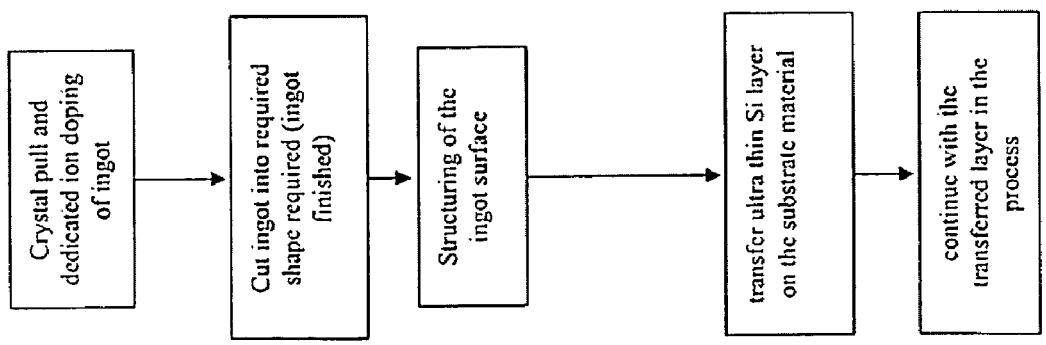

The following is a detailed description of example embodiments depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Methods, apparatus and process products for forming a product from ultra thin layers of a base material are disclosed. Some embodiments provide a process that allows one to structure a silicon base material, like the ingot, and to transfer this structure into a respective silicon process step. Some embodiments provide a process that allows one to structure any complex structured layer stacks, where the layers can be applied on top of each other using, e.g., bonding technology.

One method involves the structuring of individual layers, especially, the structuring of ultra thin silicon layers. The structuring is performed on a Si base material, like an ingot, and this structure is then transferred into the respective Si process. The structure on the base material can be transferred using ultra thin layer transfer in any other Si or glass based material. This approach is designed to replicate identical structures using a single process on the base material.

The method is intended to be used in semiconductor processing but can be applied in the same manner in different areas, e.g., the fabrication of photovoltaic devices, nano structures etc., and can also be applied to different base materials compatible with an exfoliation process.

Processes presented herein allow the use of scrap wafers from semiconductor manufacturing. The most efficient approach, however, is the use of ingot sections, several cm in length, from a silicon wafer manufacturer. Therefore, the process will in the following be described with respect to ingots.

The Si resisitivity is dialed in at the crystal pulling process via the appropriate amount of dopant added to the melt. The requirements for photovoltaic applications, for example, are as follows:

p-doped: 15-20 Ω cm
n-doped: 1.5-2 Ω cm.

The structure is placed on the ingot or base material using known methods used to structure substrates: e.g., deep RIE technology, laser drilling, lithography, etc. To realize isolation (if electrically or functionally required within the structure as well as outside,) the ingot manufacturer uses oxidation through annealing. The ingot sections are placed in an oxidation furnace at about 800-900° C. for at least 60 minutes. On the top surface, the oxide can be removed, if required, using CMP, etching or the implant cut technology.

An advantage is that the structure used later in the process is realized already on the base material (master). In this way, the high cost of structuring the material is restricted to only the master fabrication. Furthermore, this method has the advantage that the structure variation in between the replicas of the structure is controlled by the variation of the master. This allows better functionality, performance and yield.

FIG. 1 is a process flow showing how to create ultra thin Si layers with a defined structure from a Si ingot. Whereas the boxes on the left explain the separate process steps in words, the right side of FIG. 1 illustrates the respective steps. The ingot supplier has the capability to manufacture the crystal with constant doping. Thus, in a first step, the semiconductor crystal is pulled and the dedicated ion doping is performed. Subsequently, the crystal is cut into cylindrical ingots 2, which normally show a thickness of>10 cm. From those ingots, the wafers are cut using a conventional dicing saw and the diced wafers are grinded and polished to achieve the specified performance. In the case of the solar cell process, the ingots 2 are cut into square shaped ingots 4, which are a maximum of 2 cm thick. These square ingots can now be structured according to a follow onprocess, like in the such as a semiconductor, sensor, nano structure or solar process. After structuring of the ingot surface 6, ultra thin layers in the μm range can be transferred to a substrate 8 which is to be used for the dedicated product: for example, structured semiconductor sensor layers, PV solar backside contact structures, semiconductor functional layers, etc. After transferring these ultra thin layers, the substrate with the ultra thin layer on it is further processed by known methods. This is a generic process which can be used to transfer and replicate structures from a base material onto another structure further down in the process.

An exfoliation process can be performed by known methods such as, e.g., ion implantation and subsequent thermal/mechanical separation of layers. Other methods also can achieve this, such as, laser cutting, dicing, etc.

On a base material level (wafer or ingot), any structure can be applied which can later be replicated on the process product using the technology to cut ultra thin Si layers and bond them onto the substrate material or other Si layers or substrates. This allows one to transfer functional structures, e.g., for sensors or semiconductor structures, for contact transfer between layers. The transfer may be for other functional micro- or nano-structure semiconductor devices (FINFETS), or in photonic devices (grating structures or in solar cells), or contact structures.

Figure 2:
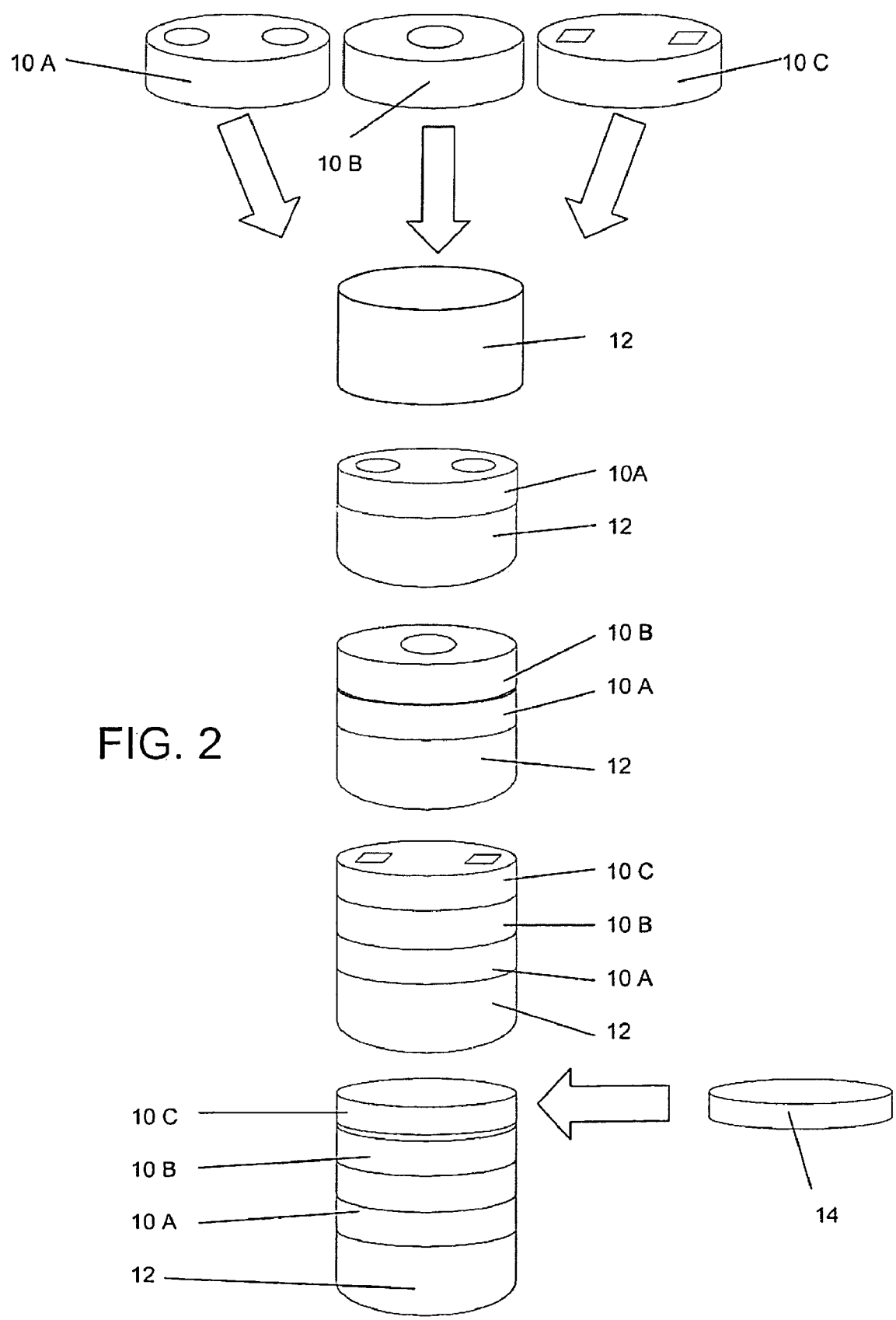
FIG. 2 is a process flow depicting a complex structure containing several ultra thin pre-structured layers.

The process flow shown in FIG. 2 depicts, as an example, a complex structure which is based on several ultra thin layers. These ultra thin layers are structured on the base material level before cutting the ultra thin sheets. After having structured the layers 10A, 10B and 10C on an ingot level as described above, ultra thin layers are cut from the base material and are bonded on the substrate material 12. This bonding can be repeated multiplicatively using the same or different structures 10A, 10B or 10C to create respective structures 12A, 12B and 12C. Finally, when the desired structure has been achieved (12C in the present case), a finish cap 14 made from glass or the like may be placed on top of the structure to complete the structure.

Through the above description, it is clear that, in order to arrive at n replicas of the respective structure, it is only necessary to produce one master at the associated high costs of defining the structure by, for example, lithographic means such as optical beam lithography. This will reduce the fabrication costs of any devices utilizing these replica foils to a large extent. There are many potential applications where, depending on the applied structure to the master, the methods described herein may be used.

Figure 3A:
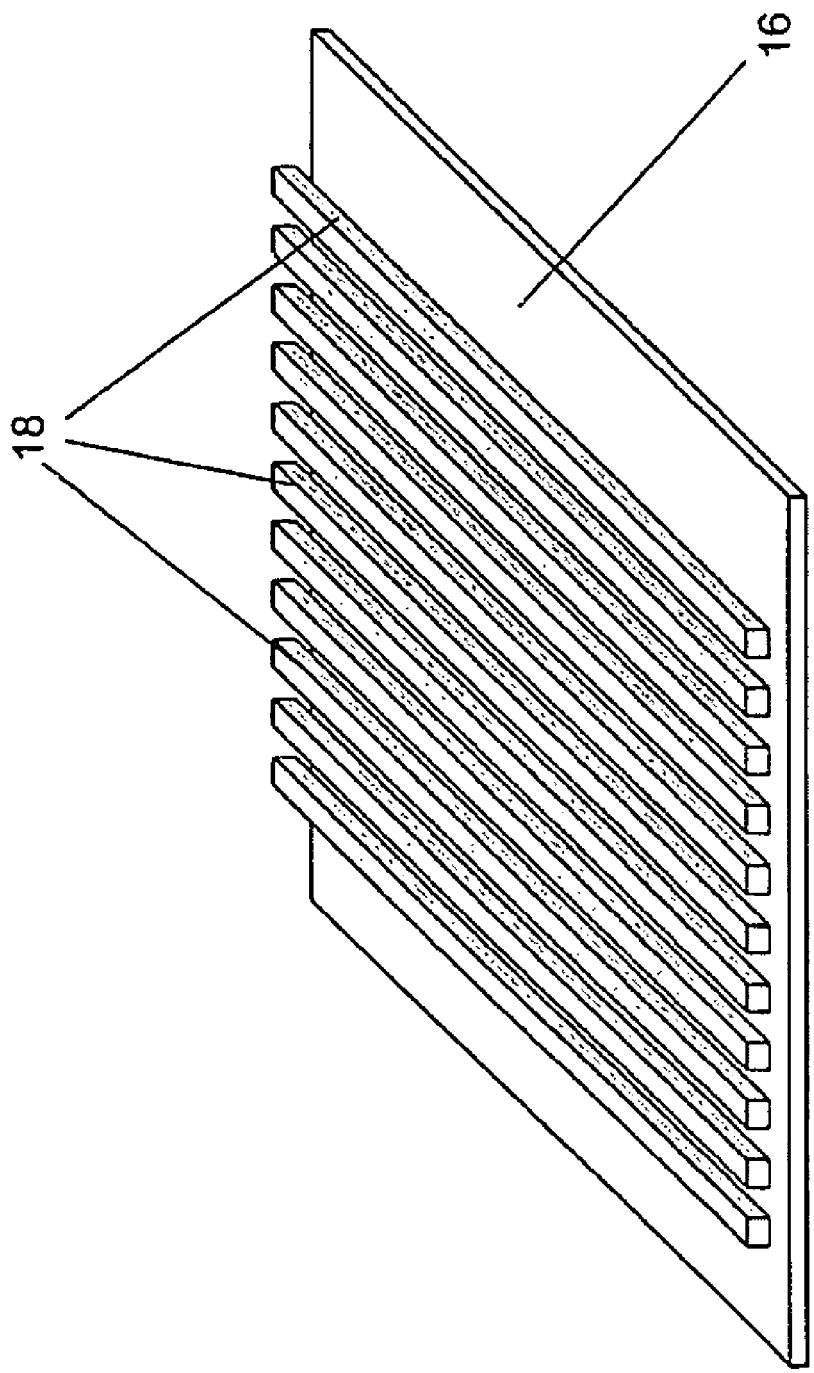
FIGS. 3A to 3C show exemplary applications utilizing the inventive method.
Figure 3B:
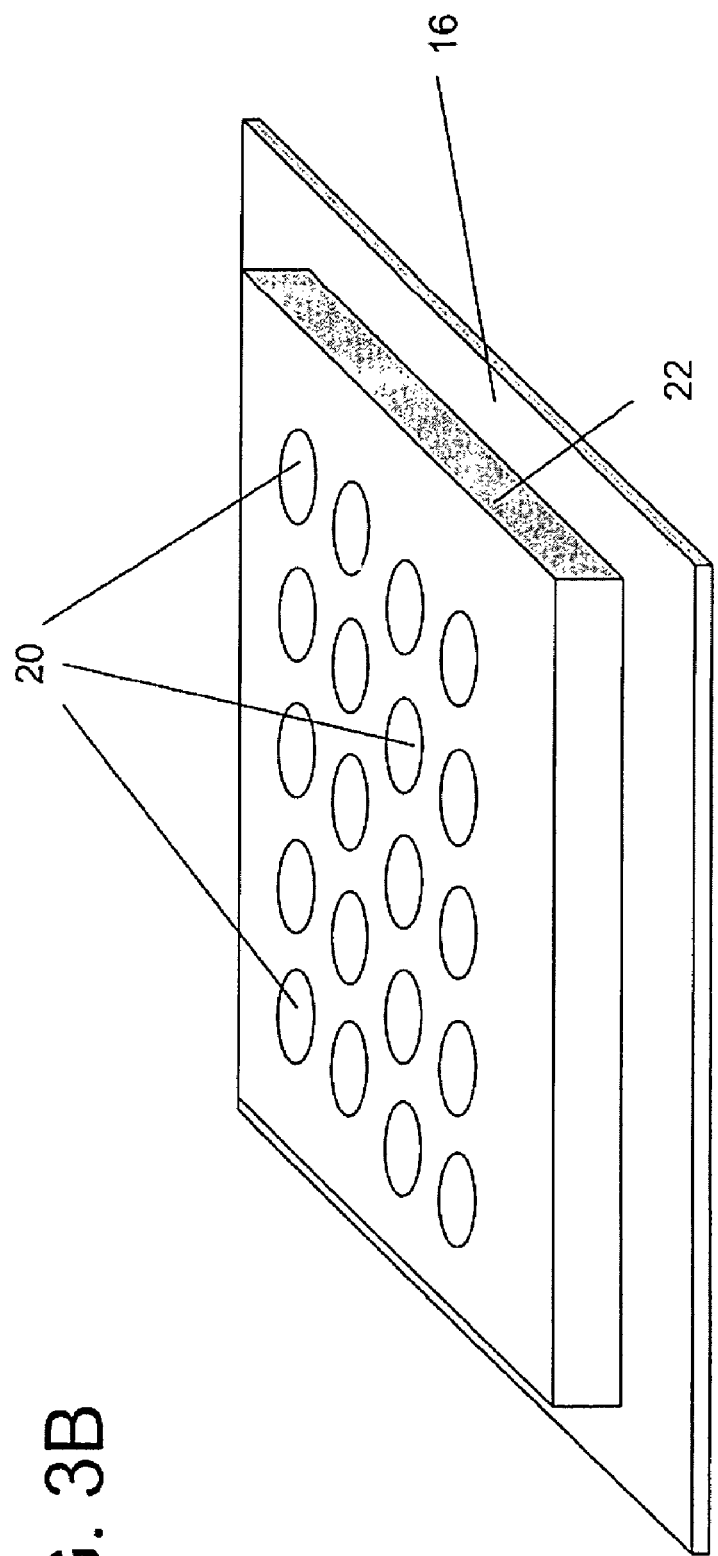

FIG. 3A shows a substrate 16 structured to arrive at etch patterns forming adjacent lines. After exfoliation, the product has thin elongated slabs 18 of material, e.g., silicon slabs. These slabs can be used, e.g., in semiconductor devices (FIN-FETS) or in photovoltaic devices (grating structures) or in solar cells. In FIG. 3B there are shown holes 20 produced in the foil 22 through etching. The holes serve the purpose of vias necessary for electrical contacting of thin stacks made from foils, but which can also be used to form photovoltaic devices. To achieve electrical contacting, the holes 20 are filled. The holes may be filled with, for example, metals through deposition methods such as sputtering or electroplating. When the foils are stacked, the holes can be used to form wiring schemes. Photovoltaic devices can be built by stacking several layers containing holes and utilizing the dielectric response difference between the layer material and the holes.

Figure 3C:
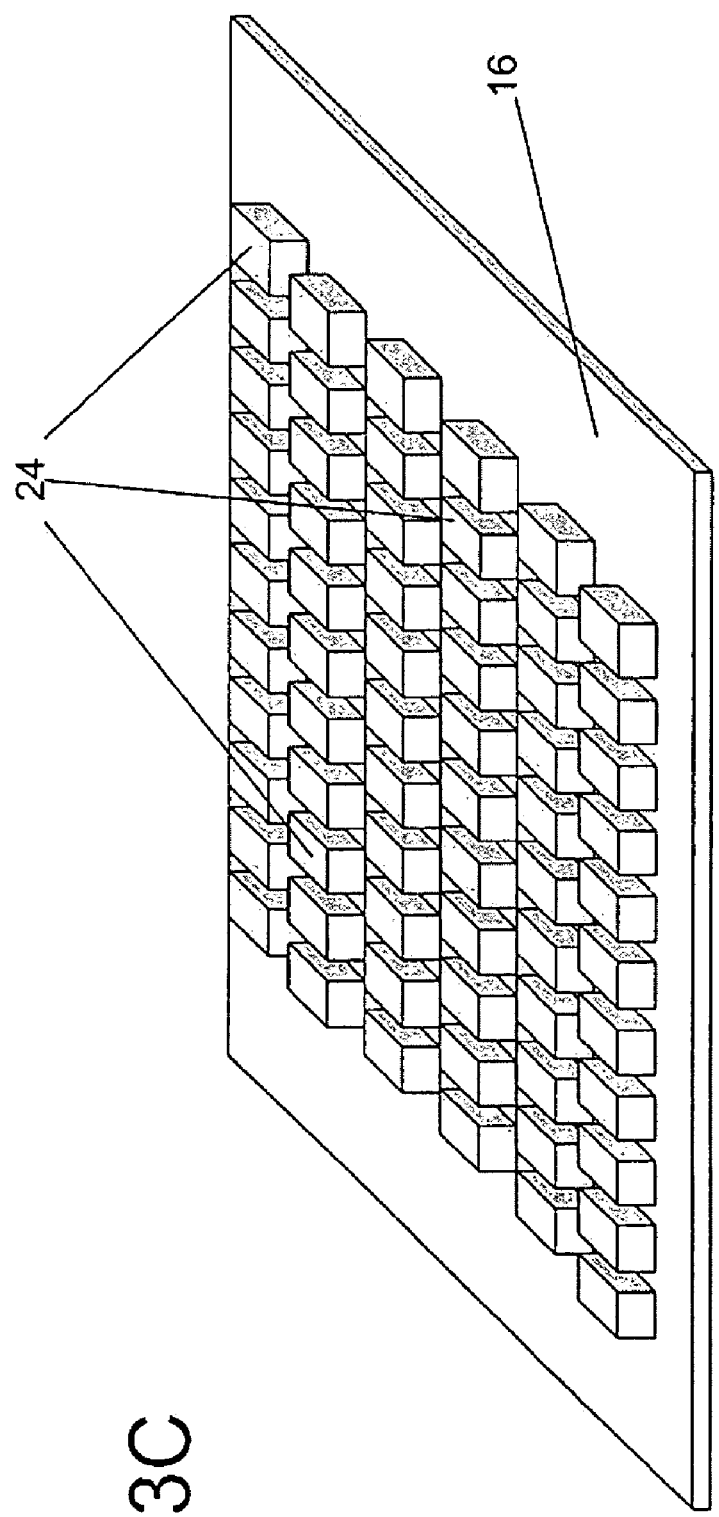

Finally, FIG. 3C shows mesa structures 24 which, when exfoliated, transform into thin areas of material, e.g., silicon. After transferring the material, all mesas are electrically insulated. These crystalline silicon pieces can be further processed to arrive at new devices such as solar cells.

FIGS. 4A to 4D schematically depict the structuring of an ingot in the case of the silicon solar cell for backside contacts. FIG. 4A shows backside holes 26 drilled into a p-doped ingot 28, e.g., by using deep reactive ion etching (RIE). The hole size is in the range of 0.5-1 mm in diameter. Isolation 30 is applied using an oxide anneal process step. The upper and lower oxide layers are removed either through etching, chemical mechanical polishing (CMP) and/or layer cutting. Thereby, the oxide will remain in the contact holes. This enables contact sputtering or plating into the hole without causing a shortcut between n- and p-layers.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope, of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of structuring individual silicon layers, comprising:
   providing a base material;
   applying a master structure to said base material, said master structure comprising vias or mesa structures;
   exfoliating at least two ultra thin layers from the master structure; and
   transferring the at least two ultra thin layers of said master structure to a desired process product.

2. The method of claim 1, wherein the process product is a semiconductor device.

3. The method of claim 1, wherein the process product is a photonic device.

4. The method of claim 1, wherein said base material is a silicon wafer or a silicon ingot.

5. The method of claim 4, wherein said master structure comprises lines or hole.

6. The method of claim 1, wherein said exfoliation process is performed by ion implantation.

7. The method of claim 6, wherein said master sructure further comprises lines or holes.

8. A semiconductor product made by a process comprising:
   providing a base material;
   applying a master structure to said base material, said master structure comprising lines, vias, or mesa structures;
   exfoliating at least two ultra thin layers from the master structure; and
   transfering the at least two ultra thin layers of said master structure to a desired process product.

9. The product of claim 8, wherein said master structure defines holes.

10. The product of claim 8, wherein the base material is silicon.

11. The product of claim 10, wherein said exfoliation process is performed by ion implantation.

12. An apparatus for forming a process product, comprising:
   a means for applying a master structure to a base material to create a structured base material, said desired structure comprising vias or mesa structures;
   a means for performing an exfoliation process to exfoliate at least two ultra thin layers from the master structure; and
   a means for transferring the at least two ultra thin layers of the master structure to the process product.

13. The apparatus of claim 12, wherein the base material is silicon.

14. The apparatus of claim 12, wherein the means for applying the master structure comprises a means for applying lines or holes.

15. The apparatus of claim 12, wherein the means for performing the exfoliation process comprises a means for performing ion implantation.

16. The apparatus of claim 15, wherein the means for applying the master structure comprises a means for applying lines or holes.

* * * * *